(12) United States Patent
Lee et al.

(10) Patent No.: US 10,045,444 B2
(45) Date of Patent: Aug. 7, 2018

(54) PRINTED CIRCUIT BOARD, PACKAGE AND METHOD OF MANUFACTURING THE SAME

(71) Applicant: Samsung Electro-Mechanics Co., Ltd., Suwon-si (KR)

(72) Inventors: Jae-Ean Lee, Busan (KR); Jee-Soo Mok, Yongin-si (KR); Young-Gwan Ko, Seoul (KR); Kyung-Hwan Ko, Gimhae (KR); Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 86 days.

(21) Appl. No.: 14/989,558

(22) Filed: Jan. 6, 2016

(65) Prior Publication Data
US 2016/0205780 A1    Jul. 14, 2016

(30) Foreign Application Priority Data
Jan. 9, 2015  (KR) .......................... 10-2015-0003598

(51) Int. Cl.
| H05K 1/18 | (2006.01) |
| H05K 3/46 | (2006.01) |
| H05K 3/40 | (2006.01) |
| H05K 1/11 | (2006.01) |
| H05K 3/00 | (2006.01) |
| H05K 3/34 | (2006.01) |

(52) U.S. Cl.
CPC .......... *H05K 3/4697* (2013.01); *H05K 1/183* (2013.01); *H05K 3/4038* (2013.01); *H05K 1/113* (2013.01); *H05K 1/115* (2013.01); *H05K 1/185* (2013.01); *H05K 3/0011* (2013.01); *H05K 3/3436* (2013.01); *H05K 3/4007* (2013.01); *H05K 2201/10* (2013.01)

(58) Field of Classification Search
CPC .......................... H05K 1/185; H05K 2201/10
USPC .................................................. 361/761–764
See application file for complete search history.

(56) References Cited

U.S. PATENT DOCUMENTS

| 2007/0030628 A1* | 2/2007 | Yamamoto ............. H01G 4/232 361/311 |
| 2013/0153269 A1* | 6/2013 | Takahashi .............. H05K 3/368 174/254 |

* cited by examiner

*Primary Examiner* — Binh Tran
(74) *Attorney, Agent, or Firm* — NSIP Law

(57) ABSTRACT

A printed circuit board includes: a core board including, on a first surface thereof, an element mounting part and an element non-mounting part; an insulation layer disposed on the element non-mounting part; a copper-clad laminate plate disposed on the insulation layer; a first penetration via penetrating the insulation layer and the copper-clad laminate plate; and a second penetration via disposed in the core board and connected to the first penetration via.

18 Claims, 23 Drawing Sheets

PRINTED CIRCUIT BOARD, PACKAGE AND METHOD OF MANUFACTURING THE SAME

CROSS-REFERENCE TO RELATED APPLICATION(S)

This application claims the benefit of Korean Patent Application No. 10-2015-0003598, filed on Jan. 9, 2015 in the Korean Intellectual Property Office, the entire disclosure of which is incorporated herein by reference for all purposes.

BACKGROUND

1. Field

The following description relates to a printed circuit board, a package, and a method of manufacturing thereof.

2. Description of Related Art

Electronic products of IT technology such as mobile phones are required to be multi-functional so that these products are slim, light, and small. In order to cope with this technical requirement, technology for embedding electronic components such as IC, semiconductor chips or active elements and passive elements in a circuit board is implemented. Recently, various technologies for embedding electronic components in the circuit board have been developed. Generally, in order to insert electronic components in a circuit board, a cavity is formed in an insulation layer of the circuit board, and electronic components such as various elements and IC and semiconductor chips are inserted in the cavity.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board includes: a core board including, on a first surface thereof, an element mounting part and an element non-mounting part; an insulation layer disposed on the element non-mounting part; a copper-clad laminate plate disposed on the insulation layer; a first penetration via penetrating the insulation layer and the copper-clad laminate plate; and a second penetration via disposed in the core board and connected to the first penetration via.

The printed circuit board may further include a cavity disposed in the element mounting part and configured to receive an element.

The first penetration via may include an inner wall on which a plating layer is formed and an exposed circuit pattern on which a metal post is formed. An inside of the first penetration via may be filled with a plug ink.

The printed circuit board may further include a mounting pad formed to be exposed to an outside of the printed circuit board on the element mounting part.

The printed circuit board may further include a mounting pad formed to be exposed to an outside of the printed circuit board on a second surface of the core board.

The printed circuit board may further include a metal protection layer formed on a surface of the mounting pad that is exposed to the outside of the printed circuit board.

According to another general aspect, a printed circuit board includes: a core board including, on a first surface thereof, an element mounting part and an element non-mounting part; an insulation layer disposed on the element non-mounting part; a copper-clad laminate plate disposed on the insulation layer; a first penetration via penetrating the copper-clad laminate plate; and a second penetration formed in the core board and connected to the first penetration via.

The printed circuit board may further include a via disposed in the insulation layer and connecting the first penetration via to the second penetration via.

The printed circuit board of claim 8, further comprising a cavity formed in the element mounting part and configured to receive an element.

The first penetration via may include an inner wall on which a plating layer is formed, and an inside of the first penetration via may be filled with a plug ink.

The printed circuit board may further include a mounting pad formed to be exposed to an outside of the printed circuit board on the element mounting part.

The printed circuit board may further include a mounting pad formed to be exposed to an outside of the printed circuit board on a second surface of the core board.

The printed circuit board may further include a metal protection layer formed on a surface of the mounting pad that is exposed to the outside of the printed circuit board.

The printed circuit board may further include a metal protection layer formed on a surface of the mounting pad that is exposed to the outside of the printed circuit board.

According to another general aspect, a package includes a printed circuit board including: a core board including, on a first surface of the printed circuit board, an element mounting part and an element non-mounting part, an insulation layer disposed on the element non-mounting part, a copper-clad laminate plate disposed on the insulation layer, and a first penetration via penetrating the insulation layer and the copper-clad laminate plate. The package further includes a first element mounted in the element mounting part.

The package may further include a second element mounted on a second surface of the printed circuit board and electrically connected to a mounting pad that is formed on the second surface of the printed circuit board.

According to another general aspect, a package includes a printed circuit board including: a core board including, on a first surface of the printed circuit board, an element mounting part and an element non-mounting part, an insulation layer disposed on the element non-mounting part, a copper-clad laminate plate formed on the insulation layer, and a first penetration via penetrating the copper-clad laminate plate. The package further includes a first element mounted in the element mounting part.

The package may further include a second element mounted on a second surface of the printed circuit board and electrically connected to a mounting pad that is formed on the second surface of the printed circuit board.

According to another general aspect, a method of manufacturing a printed circuit board includes: preparing a core board that includes, on a first surface thereof, an element mounting part and an element non-mounting part; forming an insulation layer defining an inside hole on the element non-mounting part; forming a copper-clad laminate plate further defining the inside hole on the insulation layer; forming a first penetration via in the inside hole; forming a second penetration via in the core board; and connecting the first penetration via to the second penetration via.

A cavity for receiving an element may be formed in the element mounting part.

The first penetration via may include an inner wall on which a plating layer is formed and an exposed circuit pattern on which a metal post is formed. An inside of the first penetration via may be filled with a plug ink.

The method may further include forming a mounting pad to be exposed to an outside of the printed circuit board on the element mounting part.

The method may further include forming a mounting pad to be exposed to an outside of the printed circuit board on a second surface of the core board.

The method may further include forming a metal protection layer on a surface of the mounting pad that is exposed to the outside of the printed circuit board.

The method may further include, after the preparing of the core board: forming the insulation layer defining the inside hole on the element non-mounting part; forming the copper-clad laminate plate further defining the inside hole on the insulation layer; and forming the first via in the inside hole.

The first penetration via may be connected to the second penetration via by a via formed in the insulation layer.

According to another general aspect, a method of manufacturing a package includes: preparing a core board including, on a first surface thereof, an element mounting part and an element non-mounting part; forming an insulation layer defining an inside hole on the element non-mounting part; forming a copper-clad laminate plate further defining the inside hole on the insulation layer; forming a first penetration via in the inside hole; forming a second penetration via in the core board; connecting the first penetration via to the second penetration via; and disposing a first element in the element mounting part such that the first element is electrically connected to a mounting pad formed on the element mounting part.

The package may further include a second element that is mounted on a second surface of the core board and electrically connected to a mounting pad formed on the second surface of the core board.

The method may further include, after the preparing a core board: forming the insulation layer defining the inside hole on the element non-mounting part of the core board; forming the copper-clad laminate plate further defining the inside hole on the insulation layer; forming the first via in the inside hole; and disposing the first element in the element mounting part such that the first element is electrically connected to the mounting pad formed on the element mounting part.

The first penetration via may be connected to the second penetration via by a via that is formed in the insulation layer.

The package may further include a second element that is mounted on a second surface of the core board and electrically connected to a mounting pad formed on the second surface of the core board.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Hereinafter, preferred embodiments of the present invention will be described in detail with reference to the attached drawings.

Printed Circuit Board

Figure 1:
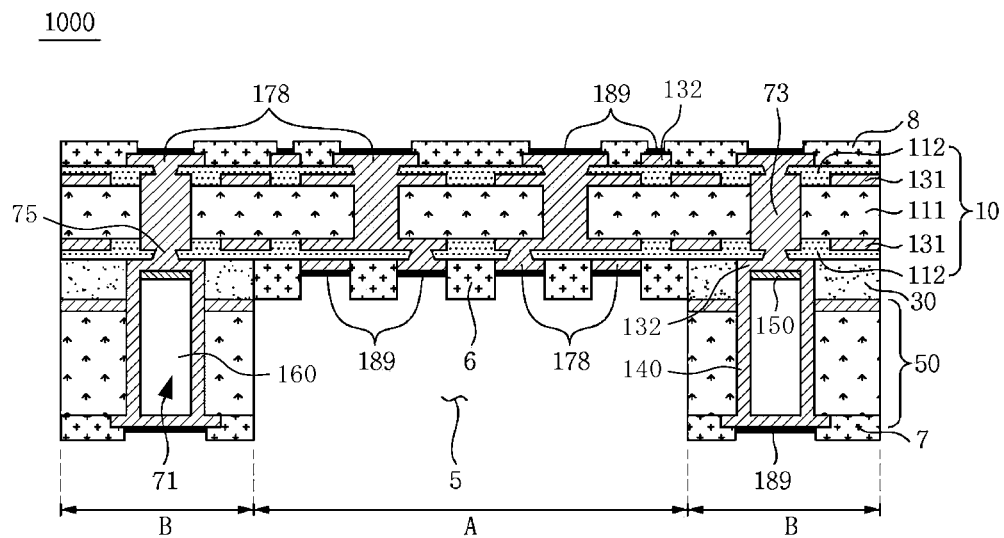
FIG. 1 is a cross-sectional view of a printed circuit board according to an embodiment.

FIG. 1 is a cross-sectional view of printed circuit board 1000 according to an embodiment.

Referring to FIG. 1, the printed circuit board 1000 includes a core board 10 that has an element mounting part A and an element non-mounting part B on a first surface of the core board 10, an insulation layer 30 that is formed on the element non-mounting part B, a copper-clad laminate plate 50 that is formed on the insulation layer 30, and a first penetration via 71 that penetrates the insulation layer 30 and the copper-clad laminate plate 50. The first penetration via 71 is connected to a second penetration via 73 that is formed in the core board 10.

The core board 10 includes a first circuit pattern 131, a second core insulation layer 112, and a second circuit pattern 132 that are formed successively on both surfaces of a first core insulation layer 111. The core board 10 is illustrated to have four circuit layers in FIG. 1, but is not limited to this particular structure.

A cavity 5 for receiving an element is formed in the element mounting part A. Also, the element mounting part A further includes a mounting pad 178 that is formed to be exposed to the outside. The mounting pad 178 is a circuit pattern on which an external component such as an electronic element is mounted and to which the external component is electrically connected.

The insulation layer 30 may be formed by a no-flow prepreg. The copper-clad laminate plate 50 is formed on the insulation layer 30. The insulation layer 30 is interposed between the core board 10 and the copper-clad laminate plate 50, and functions as a bonding sheet and minimizes an occurrence of warpage in final products.

The insulation layer 30 and the copper-clad laminate plate 50 are punched respectively when being formed, or are formed with holes that are formed inside by a drilling process. The first penetration via 71 that penetrates the insulation layer 30 and the copper-clad laminate plate 50 is formed in the inside hole.

A plating layer 140 is formed on an inner wall of the first penetration via 71 by a plating process. A metal post 150 is formed in the first penetration via 71 on the second circuit pattern 132 that is exposed to the outside, and a plug ink 160 is filled in the inside of the first penetration via 71.

The metal post 150 is formed to prevent an open failure of the circuit pattern that may be caused by a resin, which runs down during a process of manufacturing the printed circuit board 1000, of the prepreg that is formed on the element non-mounting part B.

The inside of the first penetration via 71 is filled with the plug ink by plugging. The first penetration via 71 is filled with the plug ink as an insulative material in order to prevent oxidation of the plating layer 140.

The first penetration via 71 is connected to the second penetration via 73. That is, the second penetration via 73 and the first penetration via 71 that is formed outside of the core board 10 are formed individually, and then connected to each other by means of a micro via or a circuit pattern 75. This may reduce a stress that may occur when forming a via that penetrates both the first and the second surfaces of the printed circuit board 1000 and improve a low degree of freedom for designing a penetration via.

The second surface of the core board 10 further includes a mounting pad 178 that is exposed to the outside. The mounting pad 178 that is formed on the second surface is the same as the mounting pad 178 that is formed on the element mounting part A of the first surface, and is a circuit pattern for the external component (e.g., an electronic component) to be mounted on and be electrically connected to.

The printed circuit board 1000 further includes a metal protection layer 189 that is formed on the mounting pads 178. The metal protection layer 189 may be referred to as UBM (Under Bump Metallurgy), and may include at least one metal selected from nickel (Ni), gold (Au), and ally thereof. The metal protection layer 189 protects all circuit patterns including the mounting pads 178 that are exposed to the outside from scratching, corrosion, and moisture.

On the first surface of the printed circuit board 1000, an inner solder resist layer 6 is formed on a remaining region of the element mounting part A that is not occupied by the mounting pattern 178 and the metal protection layer 189. Also, a first solder resist layer 7 and a second solder resist layer are formed on the element non-mounting part B and the second surface of the printed circuit board 1000, respectively. The solder resist layers 7 and 8 protect the circuit patterns including the mounting pad 178 and expose the circuit patterns to the outside as well.

Figure 2:
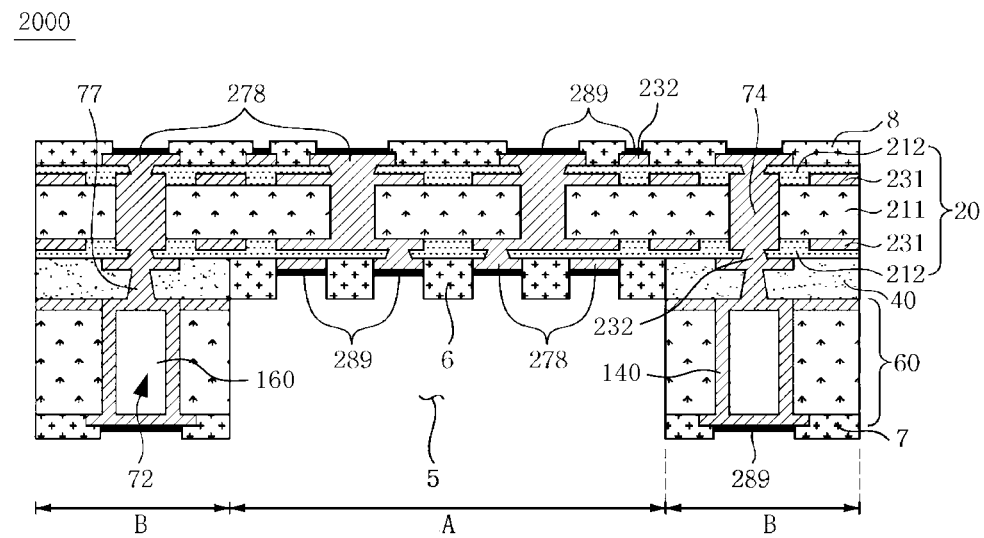
FIG. 2 is a cross-sectional view of a printed circuit board according to another embodiment.

FIG. 2 is a cross-sectional view of printed circuit board 2000 according to another embodiment.

Referring to FIG. 2, the printed circuit board 2000 includes a core board 20 that has an element mounting part A and an element non-mounting part B on a first surface of the core board 20, an insulation layer 40 that is formed on the non-mounting part B, a copper-clad laminate plate 60 that is formed on the insulation layer 40, and a first penetration via 72 that penetrates the copper-clad laminate plate 60. The first penetration via 72 is connected to a second penetration via 74 that is formed in the core board 20.

The core board 20 includes a first circuit pattern 231, a second core insulation layer 212, and a second circuit pattern 232 that are formed successively on both surfaces of a first core insulation layer 211. The core board 20 is illustrated to have four circuit layers in FIG. 2, but is not limited to this particular structure.

A cavity 5 for receiving an element is formed in the element mounting part A. Also, the element mounting part A further includes a mounting pad 278 that is formed to be exposed to the outside. The mounting pad 278 is a circuit pattern on which an external component such as an electronic element is mounted and to which the external component is electrically connected.

The insulation layer 20 may be formed by a no-flow prepreg. The copper-clad laminate plate 60 is formed on the insulation layer 40. The insulation layer 40 is interposed between the core board 20 and the copper-clad laminate plate 60, and functions as a bonding sheet and minimizes an occurrence of warpage in final products.

The copper-clad laminate plate 60 is formed with holes that are formed inside by a drilling process. The first penetration via 72 is formed in the inside hole.

A plating layer 140 is formed on an inner wall of the first penetration via 72 by a plating process, and a plug ink 160 is filled in the inside of the first penetration via 72. The first penetration via 72 is filled with the plug ink 160 as an insulative material in order to prevent oxidation of the plating layer 140.

The first penetration via 72 is connected to the second penetration via 74. That is, the second penetration via 74 and the first penetration via 72 are formed individually, and then connected to each other by means of a micro via or a circuit pattern. This may reduce a stress that may occur when forming a via that penetrates both the first and the second surfaces of the printed circuit board and improve a low degree of freedom for designing a penetration via. Accordingly, a via 77 is formed in the insulation layer 40 to connect the first penetration via 72 to the second penetration via 74.

The second surface of the core board 20 further includes a mounting pad 278 that is exposed to the outside. The mounting pad 278 that is formed on the second surface is the same as the mounting pad 278 that is formed on the element mounting part A of the first surface, and is a circuit pattern for the external component (e.g., an electronic component) to be mounted on and be electrically connected to.

The printed circuit board 2000 further includes a metal protection layer 289 that is formed on the mounting pads 278. The metal protection layer 289 may be referred to as UBM, and may include at least one metal selected from nickel (Ni), gold (Au), and ally thereof. The metal protection layer 289 protects all circuit patterns including the mounting pads 278 that are exposed to the outside from scratching, corrosion, and moisture.

On the first surface of the printed circuit board 2000, an inner solder resist layer 6 is formed on a remaining region of the element mounting part A that is not occupied by the mounting pattern 278 and the metal protection layer 289. Also, a first solder resist layer 7 and a second solder resist layer 8 are formed on the element non-mounting part B and the second surface of the printed circuit board 2000, respectively. The solder resist layers 7 and 8 protect the circuit patterns including the mounting pad 278, and expose the circuit patterns to the outside as well.

In the printed circuit boards 1000 and 2000, the occurrence of warpage may be minimized by the insulation layers 30 and 40 that function as the bonding sheet, and by forming the copper-clad laminate plates 50 and 60 on the insulation layers 20 and 30 by a lamination process.

In addition, by forming the second penetration vias 73 and 74 separately from the respective first penetration vias 71 and 72, and connecting the second penetration vias 73 and 74 to the respective first penetration vias 71 and 72 by means of a micro via or a circuit pattern (e.g., respective vias 75 and 77), a stress that may occur when forming a via that penetrates both the first and the second surfaces of the printed circuit board may be minimized and a low degree of freedom for designing a penetration via may be improved.

Package

Figure 3:
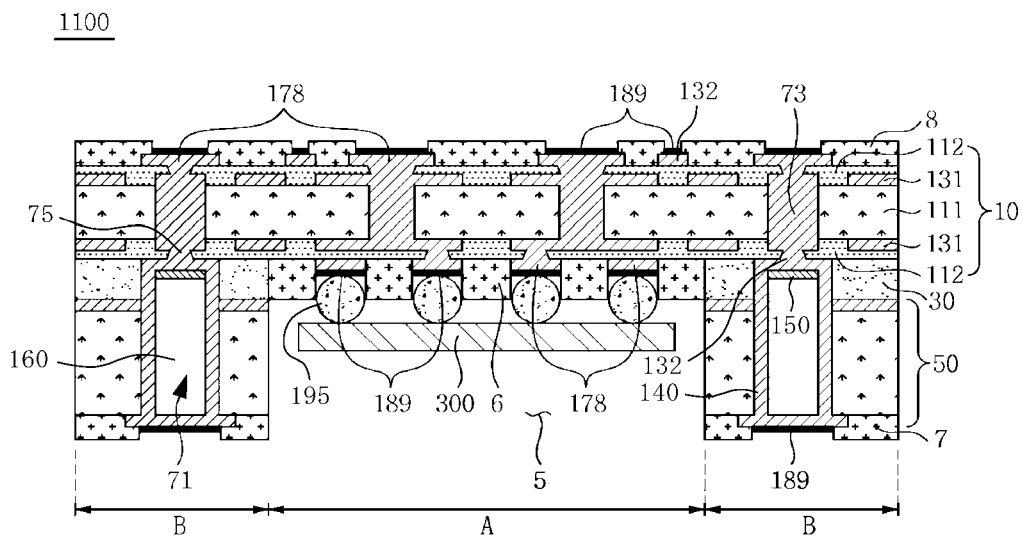
FIGS. 3 and 4 are cross-sectional views of packages according to embodiments including the printed circuit board of FIG. 1.
Figure 4:
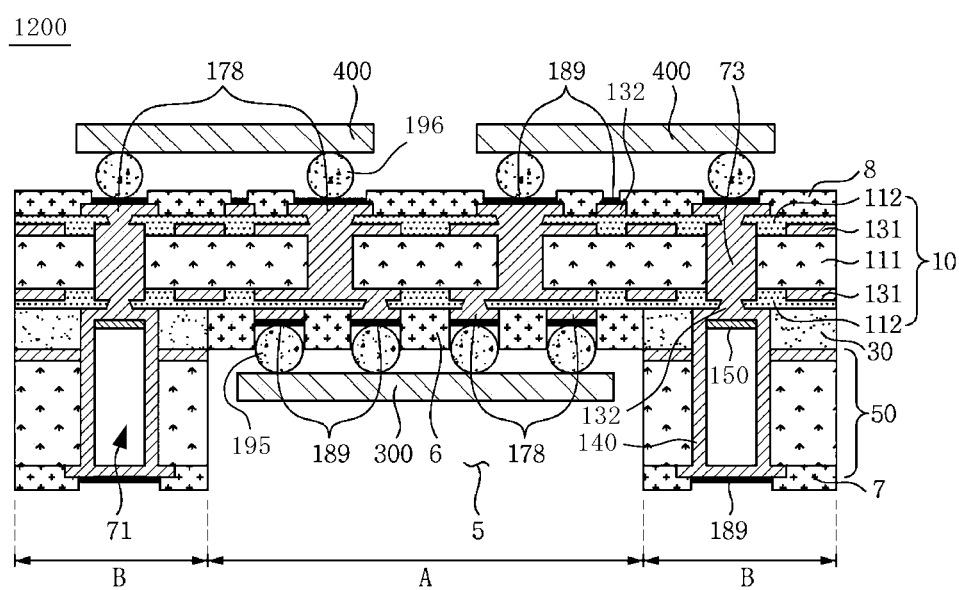

FIGS. 3 and 4 are cross-sectional views of packages 1100 and 1200 according to example embodiments.

Referring to FIG. 3, the package 1100 includes the printed circuit board 1000 and a first element 300 that is mounted on the element mounting part A of the printed circuit board 1000. The first element 300 is mounted on the element mounting part A, and electrically connected to the mounting pad 178 by flip chip bonding using a solder ball 195.

Referring to FIG. 4, the package 1200 is similar to the package 1100, but further includes a second element 400 that is electrically connected to the mounting pad 178 that is formed on the second surface of the printed circuit board 1000. The second element 400 is mounted on the element mounting part A, and electrically connected to the mounting pad 178 by bonding using a solder ball 196.

Figure 5:
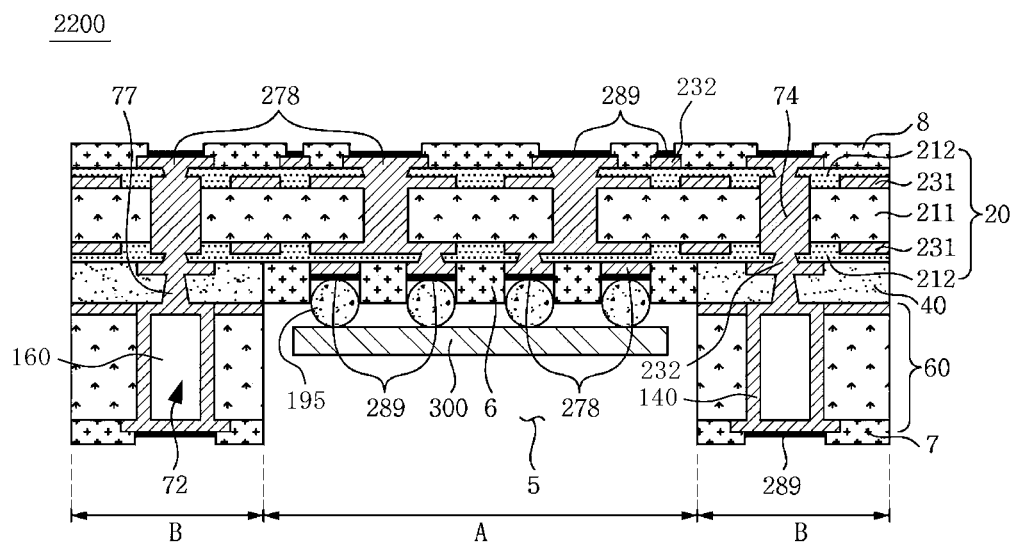
FIGS. 5 and 6 are cross-sectional views of packages according to additional embodiments including the printed circuit board of FIG. 2.
Figure 6:
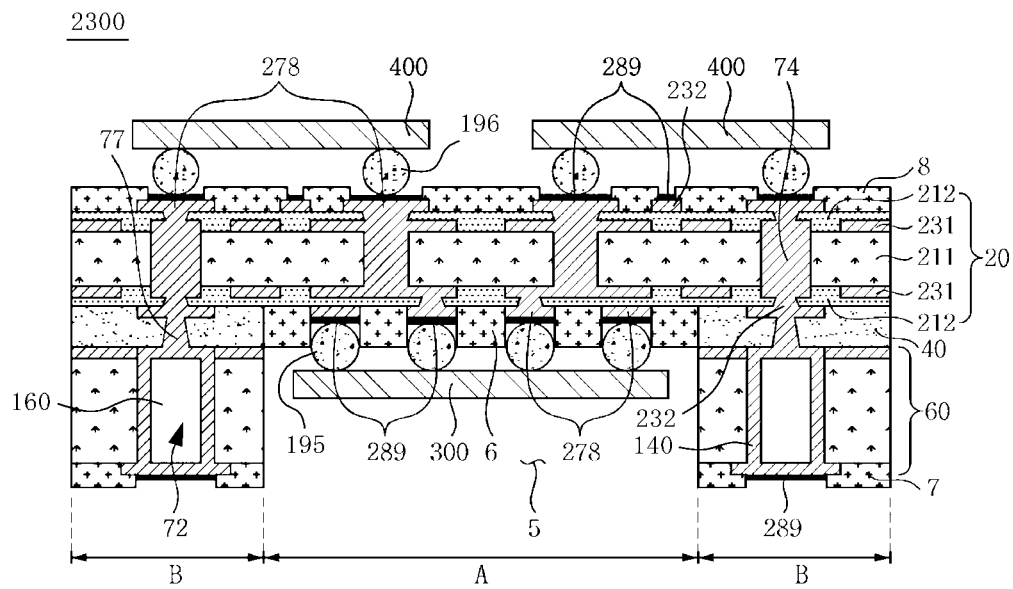

FIGS. 5 and 6 are cross-sectional views of packages 2200 and 2300 according to additional example embodiments.

Referring to FIG. 5, the package 2200 includes the printed circuit board 2000 and the first element 300 that is mounted on the element mounting part A of the printed circuit board 1000. The first element 300 is mounted on the element mounting part A, and electrically connected to the mounting pad 278 by flip chip bonding using the solder ball 195.

Referring to FIG. 6, the package 2300 is similar to the package 2200, but further includes the second element 400 that is electrically connected to the mounting pad 278 that is formed on the second surface of the printed circuit board 2000. The second element 400 is mounted on the element mounting part A, and electrically connected to the mounting pad 278 by bonding using a solder ball 196.

In the packages 1100, 1200, 2200 and 2300, the occurrence of warpage may be minimized. By forming the second penetration vias 73 and 74 separately from the respective first penetration vias 71 and 72, and connecting the second penetration vias 72 and 74 to the respective first penetration vias 71 and 72 by means of a micro via or a circuit pattern (e.g., respective vias 75 and 77), a stress that may occur when forming a via that penetrates both the first and the second surfaces of the printed circuit board may be minimized and a low degree of freedom for designing a penetration via may be improved.

Method of Manufacturing Printed Circuit Board

Figure 7:
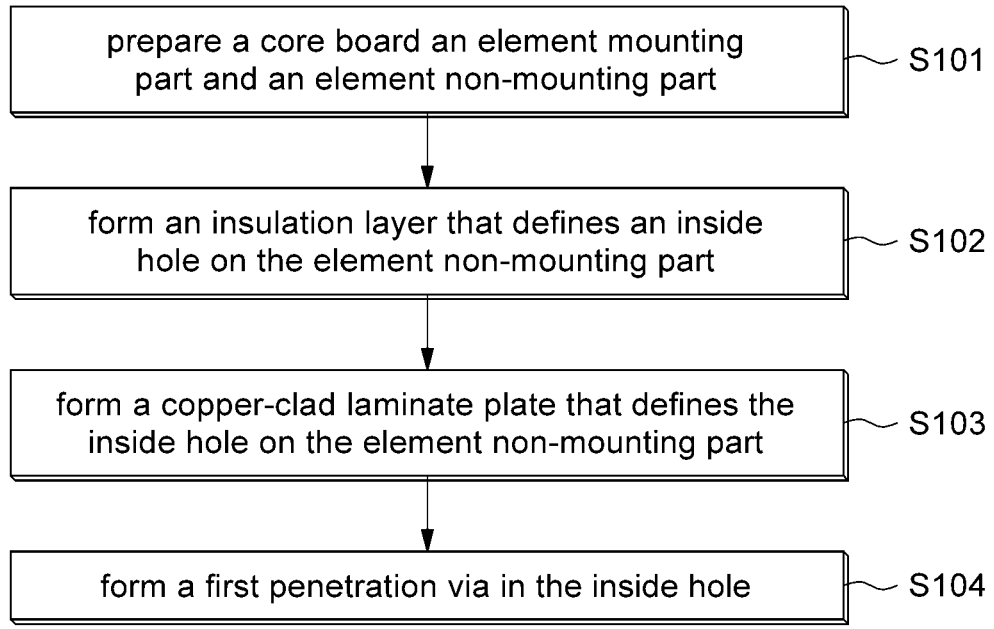
FIG. 7 is a flowchart showing a method of manufacturing the printed circuit board of FIG. 1, according to an embodiment.

FIG. 7 is a flowchart showing a method of manufacturing the printed circuit board 1000 illustrated in FIG. 1, according to tan embodiment.

Referring to FIG. 7, the method of manufacturing the printed circuit board 1000 includes preparing the core board 10 that includes the element mounting part A and an element non-mounting part B on the first surface of the core board 10 (operation S101), forming the insulation layer 30 that defines an inside hole on the element non-mounting part B of the core board 10 (operation S102), forming the copper-clad laminate plate 50 that further defines the inside hole on the insulation layer 30 (operation S103), and forming the first penetration via 71 in the inside hole (operation S104). The first penetration via 71 is connected to the second penetration via 73 that is formed in the core board 10.

FIGS. 11 through 28 are process diagrams showing the method of manufacturing the printed circuit board 1000.

Referring to FIGS. 11 through 15, the first core metal layer 121 is disposed on both surfaces of the first core insulation layer 111, and the first circuit pattern 131 is formed on both surfaces of the first core insulation layer 111 by patterning and processing the first core metal layer 121.

The second core insulation layer 112 is formed on the first circuit pattern 131 and the second core metal layer 122 is formed on the first core insulation layer 112 to form the core board 10.

The second circuit pattern 132 that includes the mounting pad 178 and the second penetration via 73 are formed by patterning the second core metal layer 122 that is formed on the first surface of the core board 10.

Figure 16:
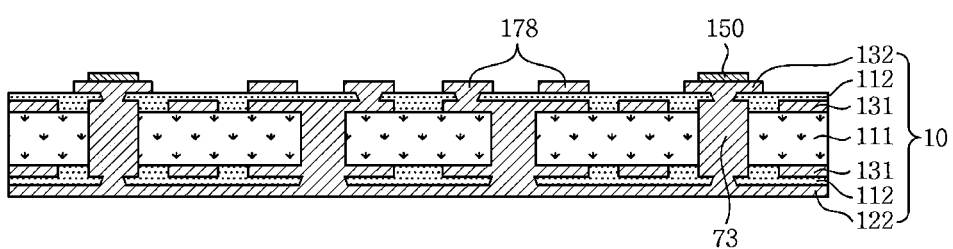
Figure 17:
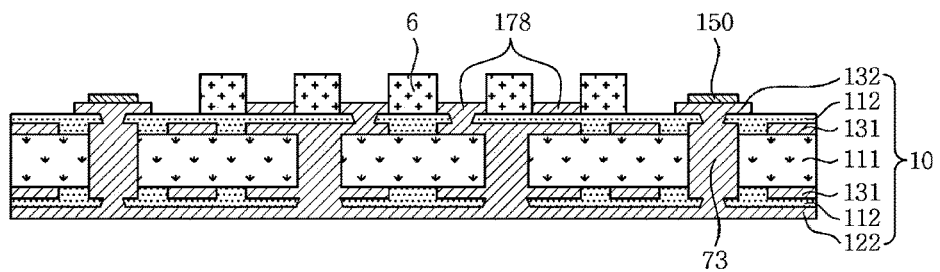
Figure 18:
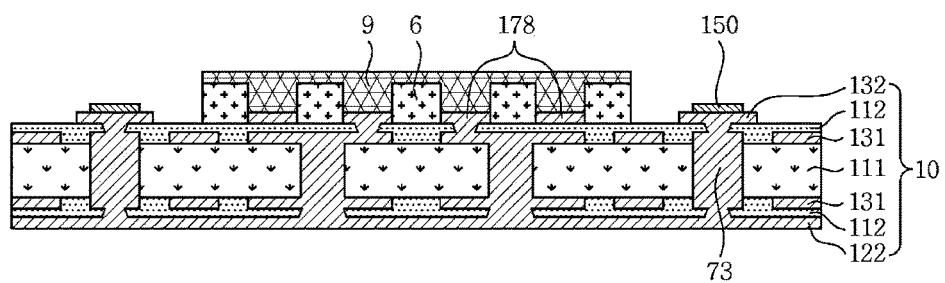

Referring to FIGS. 16 through 18, the metal post 150 is formed on the second circuit pattern 132 that is formed on the first surface of the core board 10, and the inner solder resist layer 6 is formed in the empty spaces between the mounting pads 178.

A dry film resist layer 9 is formed to cover the surfaces of the inner solder resist layer 6 and the mounting pads 178. The dry film resist layer 9 is a protection layer configured for protecting the surfaces of the inner solder resist layer 6 and the mounting pads 178 from the outside. For example, the dry film resist layer 9 prevents the mounting pads 178 from being contacted with an etching solution during etching process so that the mounting pads 178 are protected from being damaged.

Through the aforementioned steps, the core board 10 including the element mounting part A and the element non-mounting part B on its first surface is prepared.

Figure 19:
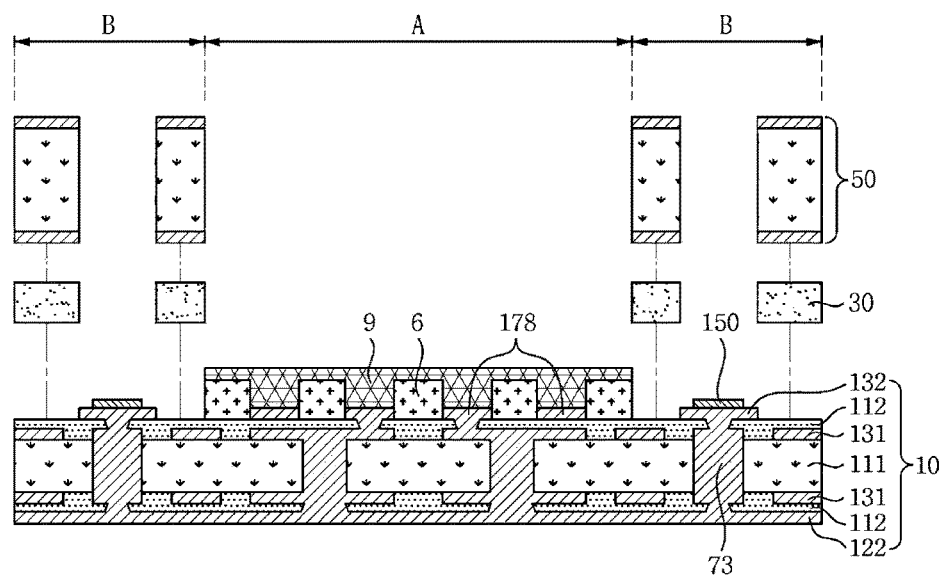

Referring to FIG. 19, the insulation layer 30 and the copper-clad laminate plate 50 that define the inside hole are formed successively on the element non-mounting part B of the core board 10. For example, the inside hole may be formed in the insulation layer 30 by a punching process, and may be further formed in the copper-clad laminate plate 50 by a drilling process, but is not limited to being formed by these processes.

Figure 20:
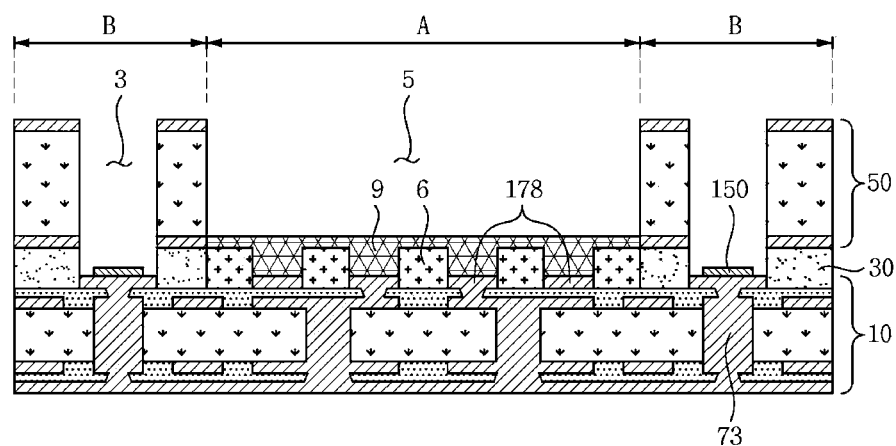

Referring to FIG. 20, as the insulation layer 30 and the copper-clad laminate plate 50 that have the inside hole are formed successively, a hole 3 is formed in the element non-mounting part B, and the cavity 5 for receiving an element is formed in the element mounting part A.

The metal post 150 is exposed to the outside through the hole 3. The metal post 150 is formed to prevent an open failure of the circuit pattern that may be caused by a resin of the insulation layer 30 that is formed on the element non-mounting part B. The insulation layer 30 may be formed by a no-flow prepreg.

Figure 21:
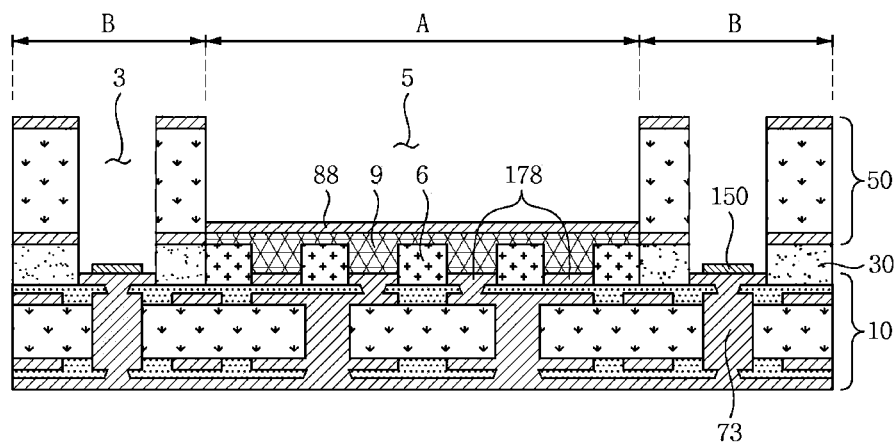
Figure 22:
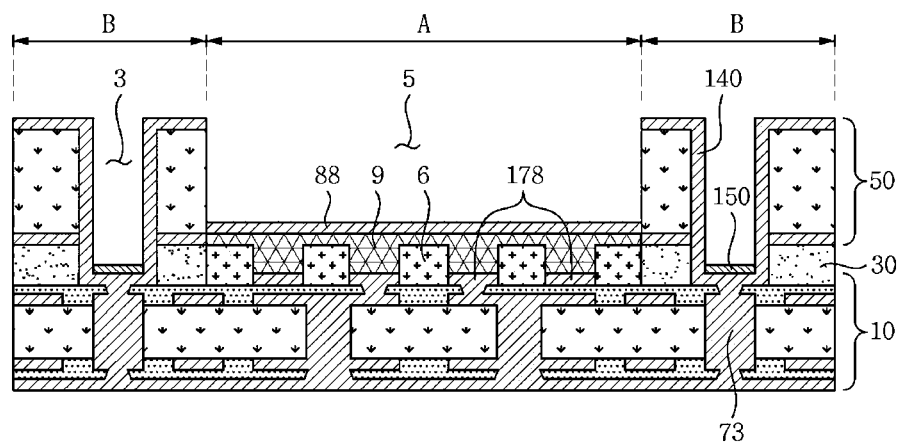

Referring to FIGS. 21 and 22, a sputter layer 88 is formed on the dry film resist layer 9 that is formed on the element mounting part A, and the plating layer 140 is formed on the inner wall of the hole 3 by plating process. For example, the sputter layer 88 and the plating layer 140 may be formed of copper, which is generally used in this field of technology, but are not limited to this metal.

Figure 23:
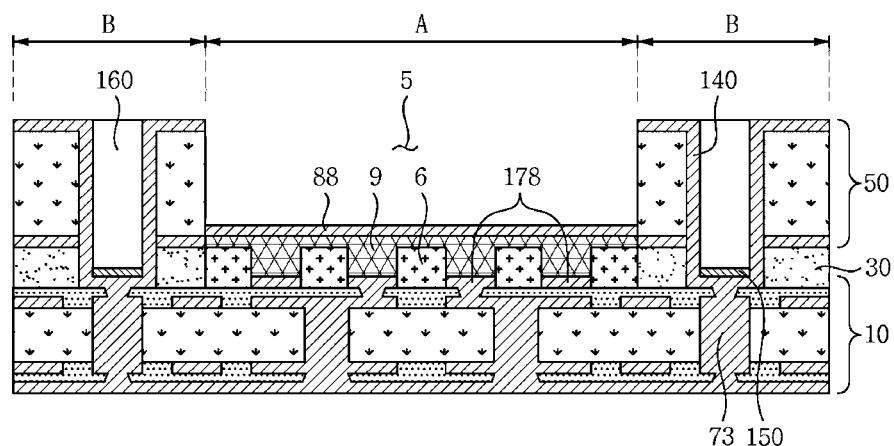
Figure 24:
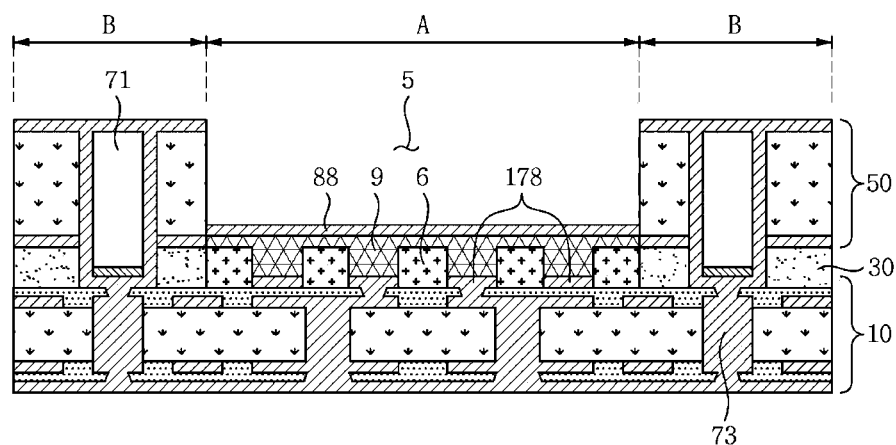
Figure 25:
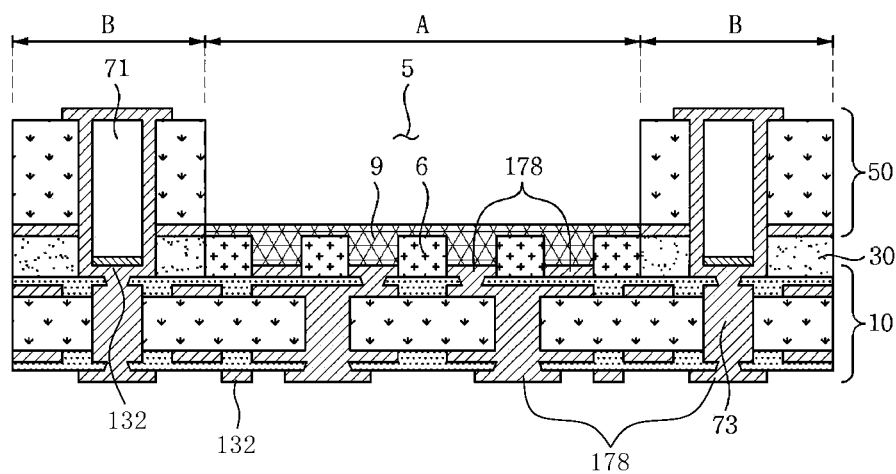

Referring to FIGS. 23 through 25, the inside of the hole 3 is filled with the plug ink 160 by plugging process, and then a grinding process is performed.

The first penetration via 71 is formed by performing cap plating on the surface of the element non-mounting part B.

The second circuit pattern 132 having the mounting pad 178 that is formed on the second surface to be exposed to the outside is formed by performing a tenting process on the first and the second outer surfaces of the core board 10. The sputter layer 88 that is formed on the surface of the element mounting part A is removed by tenting process.

Figure 26:
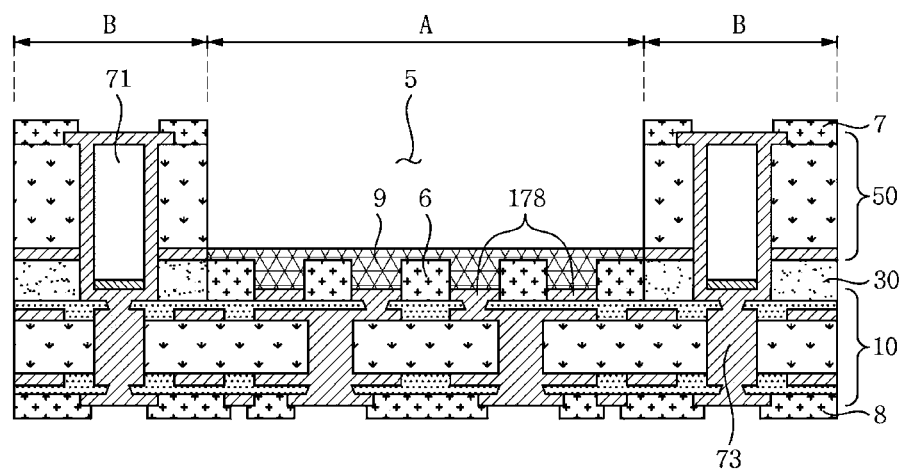
Figure 27:
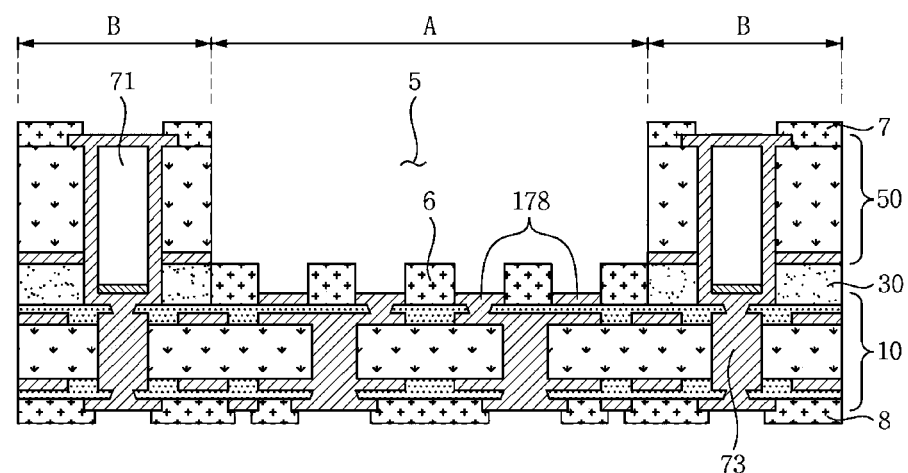

Referring to FIGS. 26 and 27, the first solder resist layer 7 and the second solder resist layer 8 are formed respectively on the element non-mounting part B and the second surface of the core board 10. The solder resist layers 7 and 8 protect the circuit patterns including the mounting pad 178 and expose the circuit patterns to the outside as well.

The dry film resist layer 9 that is formed on the element mounting part A is removed.

Figure 28:
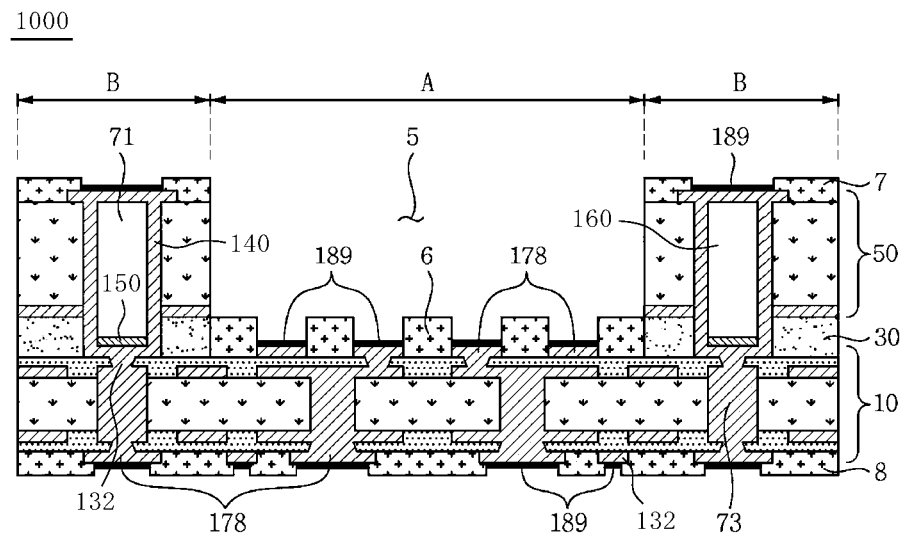
Figure 29:
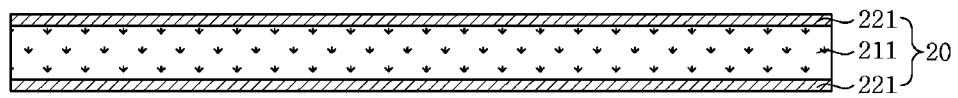
FIGS. 29 through 46 are process diagrams showing the method of manufacturing the printed circuit board of FIG. 2, according to an embodiment.
Figure 30:
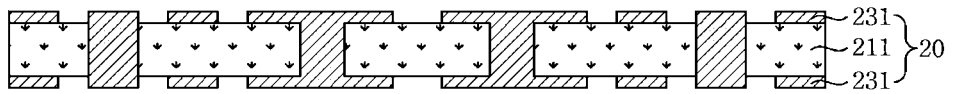
Figure 31:
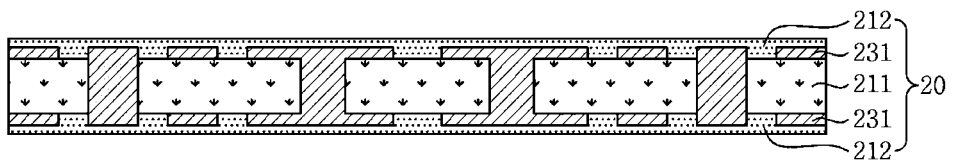
Figure 32:
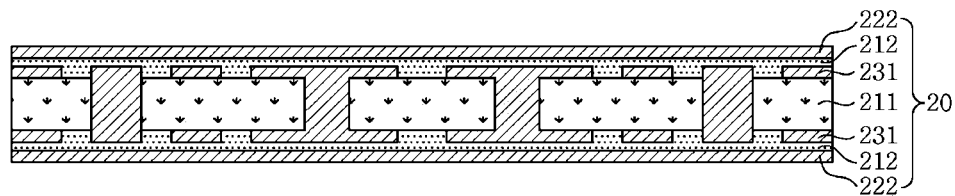
Figure 33:
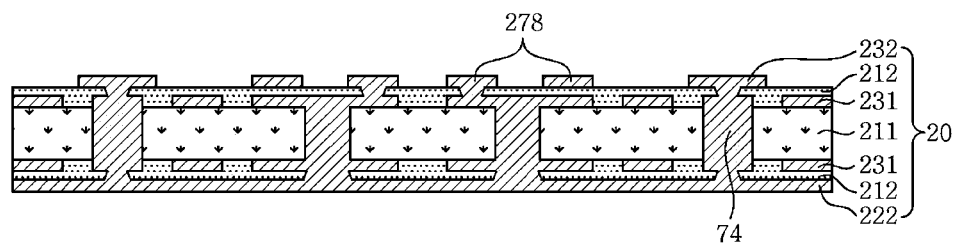

Referring to FIG. 28, the metal protection layer 189 is formed on the surfaces of circuit patterns that are formed on the first and the second surfaces of the core board 10 and have mounting pads 178 that are exposed to the outside, so that manufacturing of the printed circuit board 1000 is completed.

The metal protection layer 189 may be referred to as UBM (Under Bump Metallurgy), and include at least one metal selected from nickel (Ni), gold (Au), and ally thereof. The metal protection layer 189 protects all circuit patterns including the mounting pads 178 that are exposed to the outside from a scratch, a corrosion, and a moisture.

Figure 8:
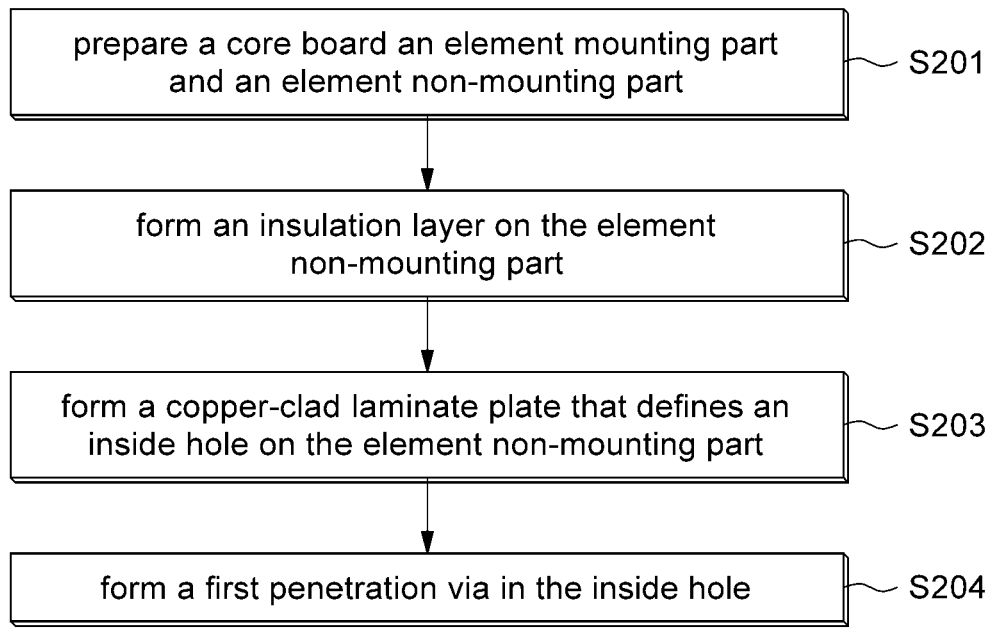
FIG. 8 is a flowchart showing a method of manufacturing the printed circuit board of FIG. 2, according to an embodiment.

FIG. 8 is a flowchart showing a method of manufacturing the printed circuit board 2000 illustrated in FIG. 2, according to an embodiment.

Referring to FIG. 8, the method of manufacturing the printed circuit board 2000 includes preparing the core board 20 that includes the element mounting part A and the element non-mounting part B on the first surface of the core board 20 (operation S201), forming the insulation layer 40 on the element non-mounting part B of the core board 20 (operation S202), forming the copper-clad laminate plate 60 that defines an inside hole on the insulation layer 40 (operation S203), and forming the first penetration via 72 in the inside hole (operation S204). The first penetration via 72 is connected to the second penetration via 74 that is formed in the core board 20.

FIGS. 29 through 46 are process diagrams showing the method of manufacturing the printed circuit board 2000.

Referring to FIGS. 29 through 33, the first core metal layer 221 is disposed on both surfaces of the first core insulation layer 211, and the first circuit pattern 231 is formed on both surfaces of the first core insulation layer 221 by patterning and processing the first metal core layer 221.

The second core insulation layer 212 is formed on the first circuit pattern 231 and the second core metal layer 222 is formed on the first core insulation layer 212 to form the core board 20.

The second circuit pattern 232 that includes the mounting pad 278 and the second penetration via 74 are formed by patterning the second core metal layer 222 that is formed on the first surface of the core board 20.

Figure 34:
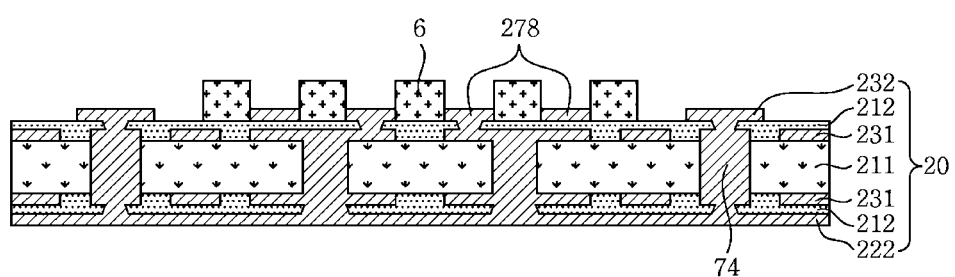
Figure 35:
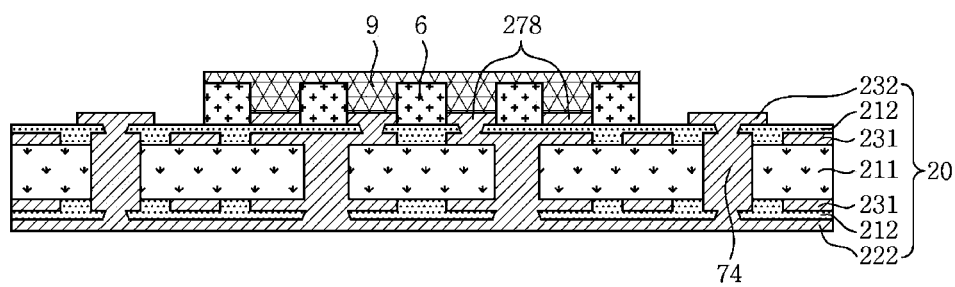

Referring to FIGS. 34 and 35, the inner solder resist layer 6 is formed in the empty spaces between the mounting pads 278.

A dry film resist layer 9 is formed to cover the surfaces of the inner solder resist layer 6 and the mounting pads 278. The dry film resist layer 9 is a protection layer configured for protecting the surfaces of the inner solder resist layer 6 and the mounting pads 278 from the outside. For example, the dry film resist layer 9 prevents the mounting pads 278 from being contacted with an etching solution during etching process so that the mounting pads 278 are protected from being damaged.

Through the aforementioned steps, the core board 20 that has the element mounting part A and the element non-mounting part B on the first surface of the core board 20 is prepared.

Figure 36:
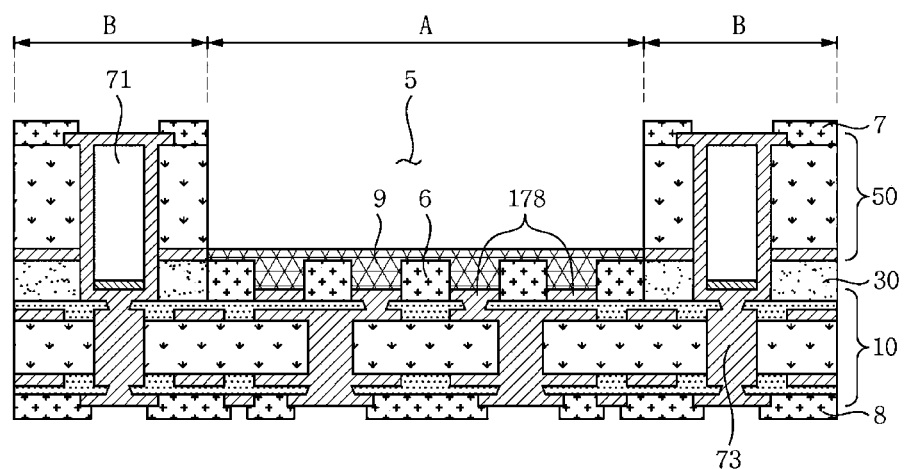

Referring to FIG. 36, the insulation layer 40 and the copper-clad laminate plate 60 that define the inside hole are formed successively on the element non-mounting part B of the core board 20. For example, the inside hole may be formed in the copper-clad laminate plate 60 by a drilling process, but is not limited to this process.

Figure 37:
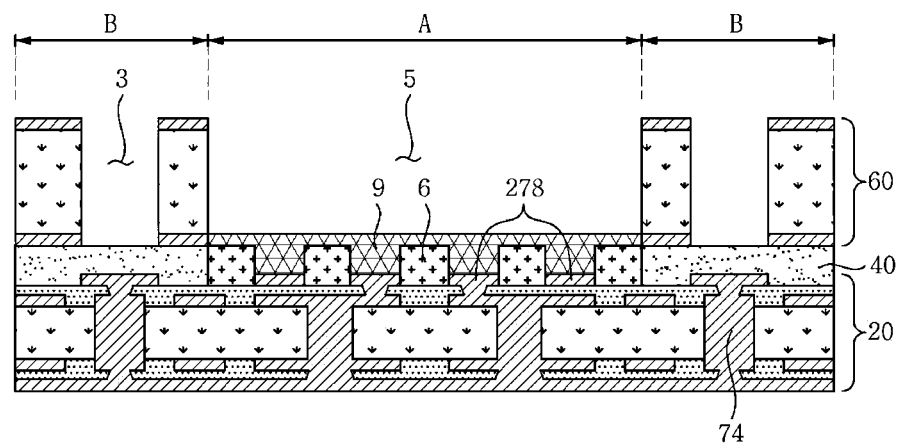

Referring to FIG. 37, as the insulation layer 40 and the copper-clad laminate plate 60 defining the inside hole are formed successively, a hole 3 is formed in the element non-mounting part B, and the cavity 5 for receiving an element in the element mounting part A. The insulation layer 40 may be formed by a no-flow prepreg.

Figure 38:
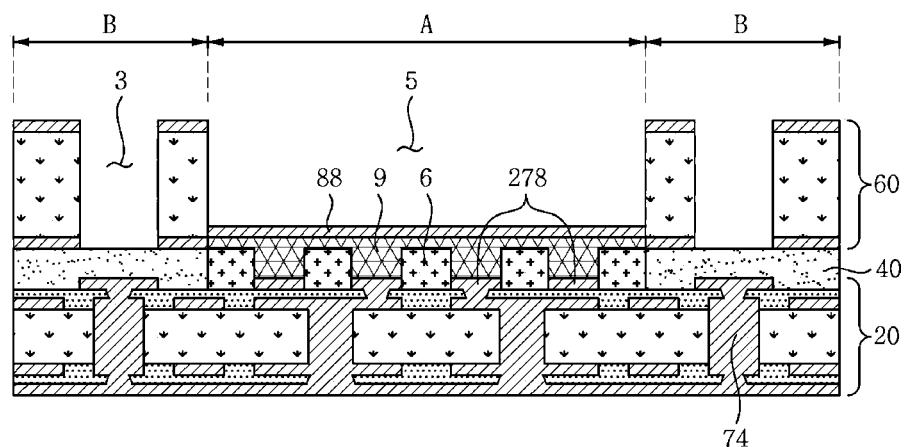
Figure 39:
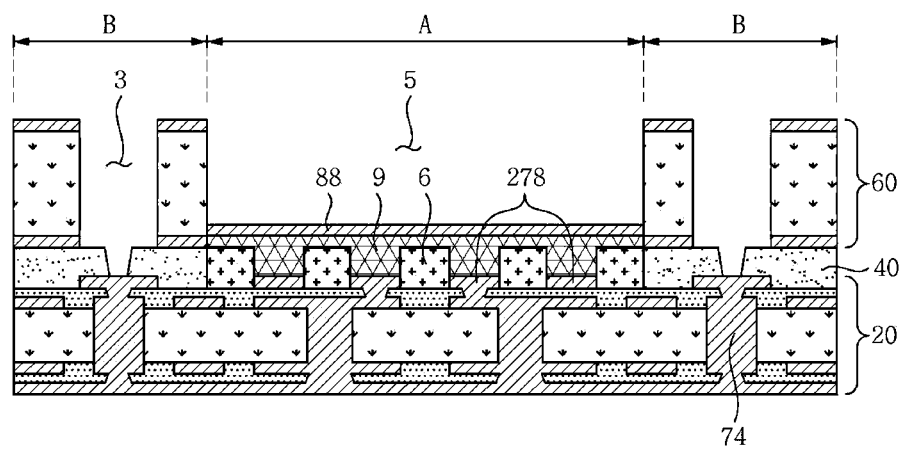
Figure 40:
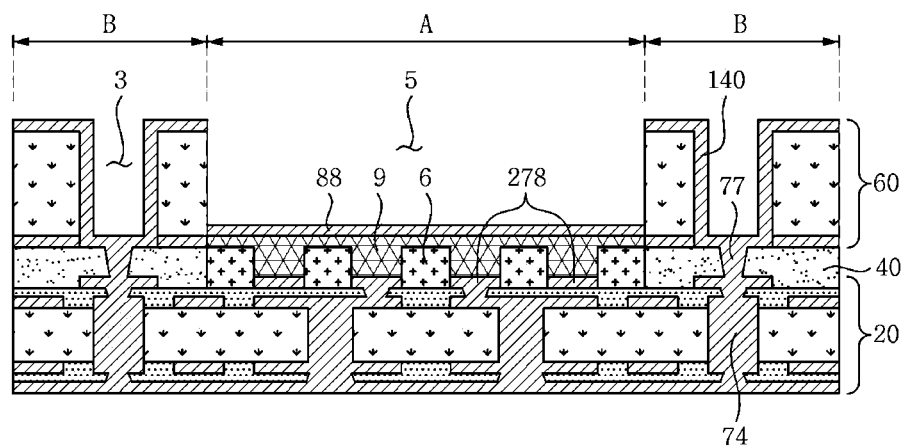

Referring to FIGS. 38 through 40, a sputter layer 88 is formed on the dry film resist layer 9 that is formed on the element mounting part A, and a via hole is formed in a portion of the insulation layer 40 that is exposed to the outside.

The plating layer 140 is formed on the inner wall of the hole 3 by a plating process, and the via 77 is formed in the via hole that is formed in the insulation layer 40. For example, the sputter layer 88, the via 77, and the plating layer 140 may be formed of copper, which is generally used in this field of technology, but are not limited to this metal.

Figure 41:
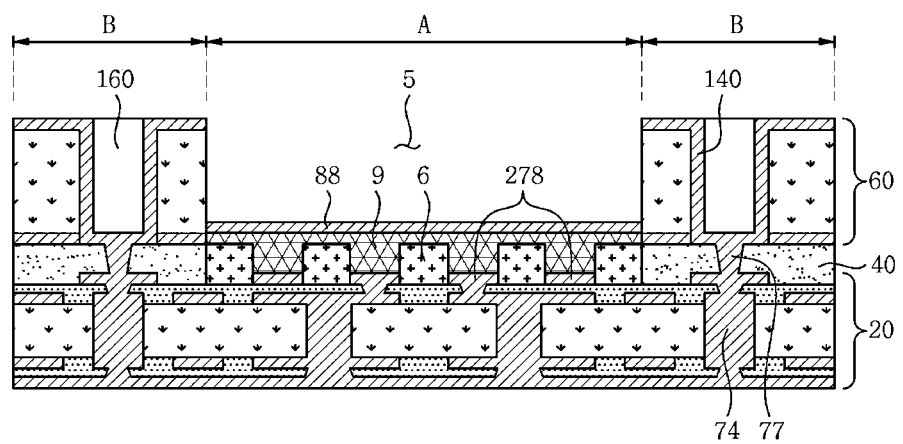
Figure 42:
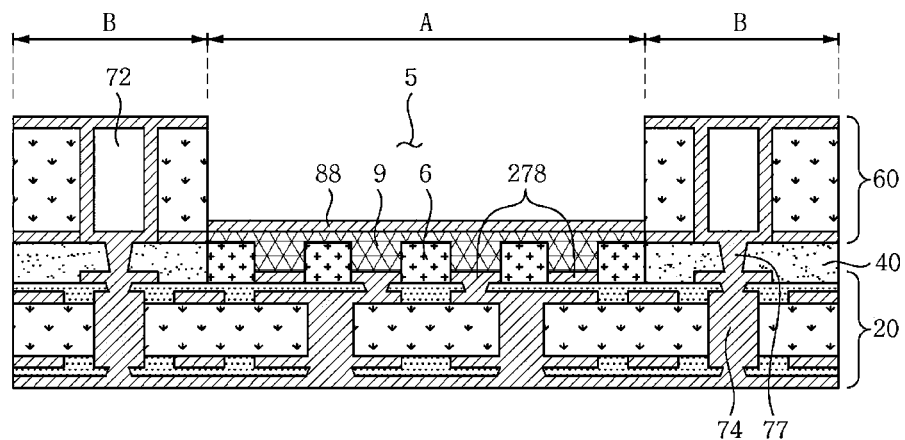
Figure 43:
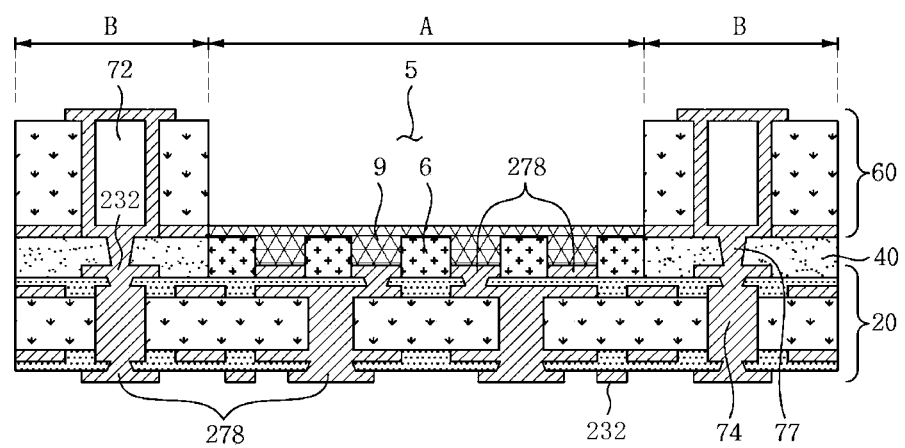

Referring to FIGS. 41 through 43, the inside of the hole 3 is filled with the plug ink 160 by plugging process, and then a grinding process is performed.

The first penetration via 72 is formed by performing cap plating on the surface of the element non-mounting part B.

The second circuit pattern 232 having the mounting pad 278 that is formed on the second surface of the core board 20 to be exposed to the outside is formed by performing a tenting process on the first and the second outer surfaces of the core board 20. The sputter layer 88 that is formed on the surface of the element mounting part A is removed by the tenting process. By this process, the first penetration via 72 is connected to the second penetration via 74 that is formed inside of the core board 20 by the via 77 that is formed in the insulation layer 40.

Figure 44:
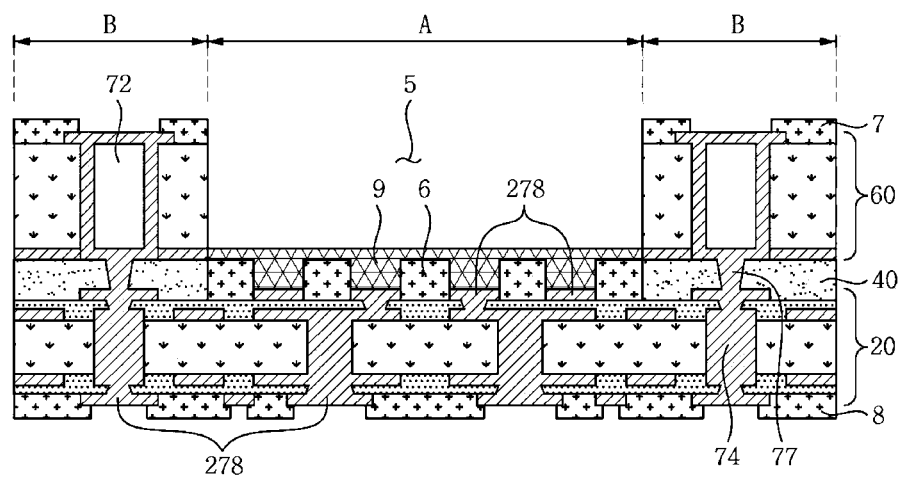
Figure 45:
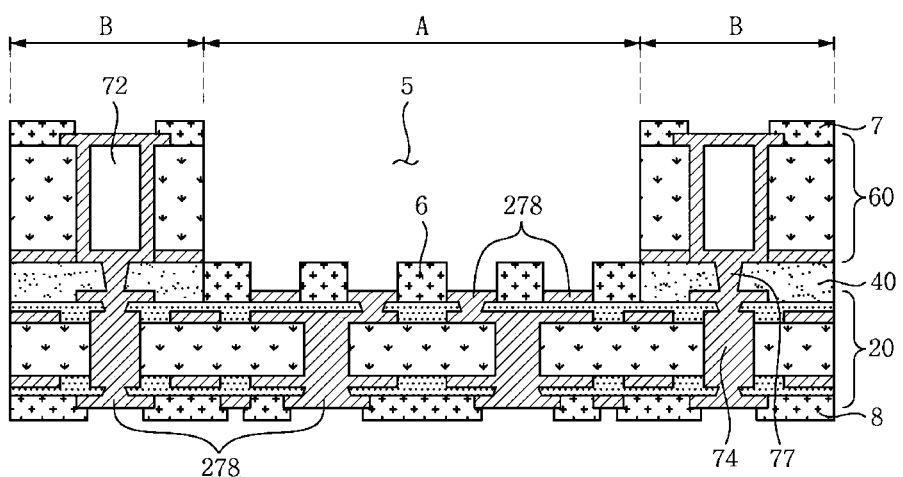

Referring to FIGS. 44 and 45, the first solder resist layer 7 and the second solder resist layer 8 are formed respectively on the element non-mounting part B and the second surface of the core board 20. The solder resist layers 7 and 8 protect the circuit patterns including the mounting pad 278 and expose the circuit patterns to the outside as well.

The dry film resist layer 9 that is formed on the element mounting part A is removed.

Figure 46:
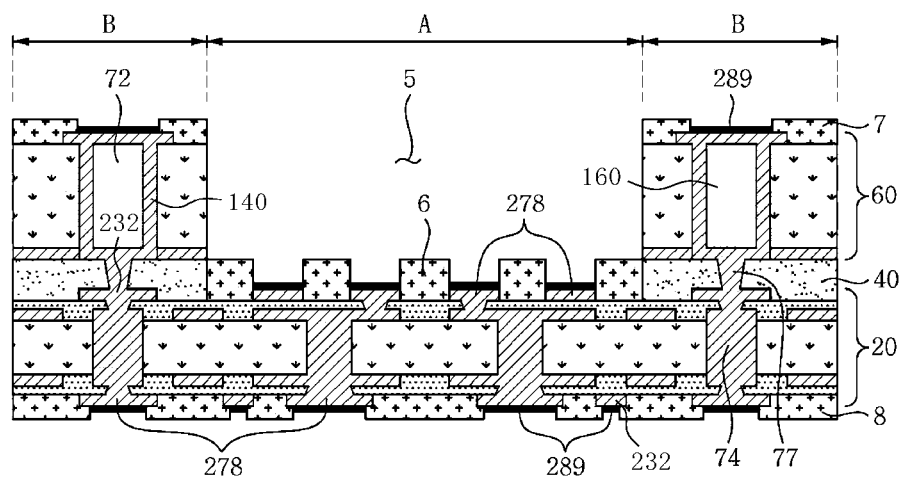

Referring to FIG. 46, the metal protection layer 289 is formed on the surfaces of circuit patterns that are formed on the first and the second surfaces of the core board 20 and have mounting pads 278 that are exposed to the outside, so that manufacturing of the printed circuit board 2000 is completed.

The metal protection layer 289 may be referred to as UBM (Under Bump Metallurgy), and include at least one metal selected from nickel (Ni), gold (Au), and ally thereof. The metal protection layer 289 protects all circuit patterns including the mounting pads 278 that are exposed to the outside from a scratch, a corrosion, and a moisture.

Figure 47:
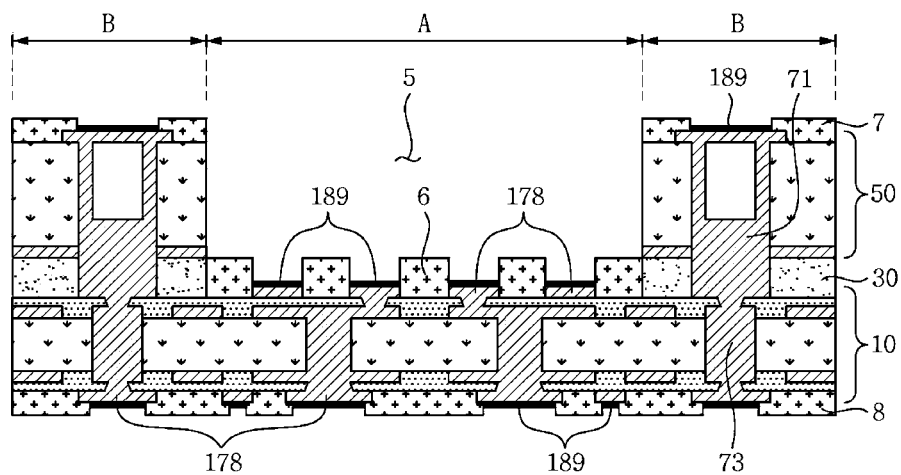
FIGS. 47 through 49 are cross-sectional views of various examples of a first penetration via of FIG. 1.
Figure 48:
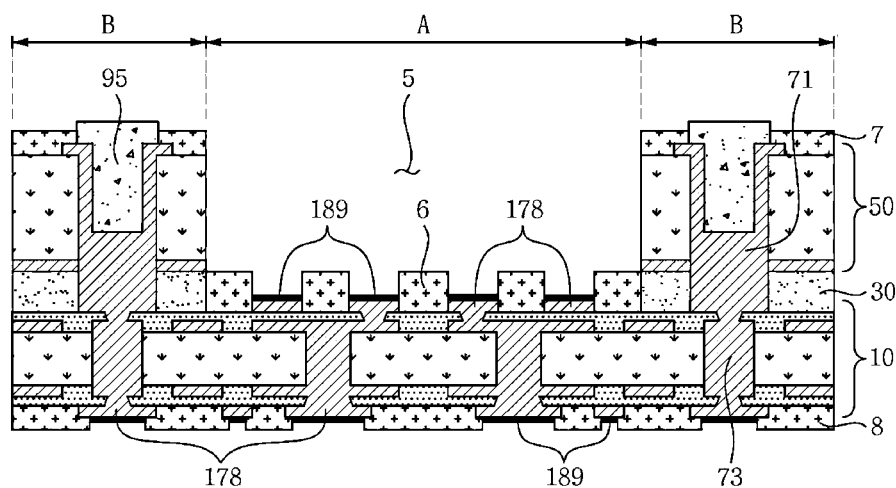
Figure 49:
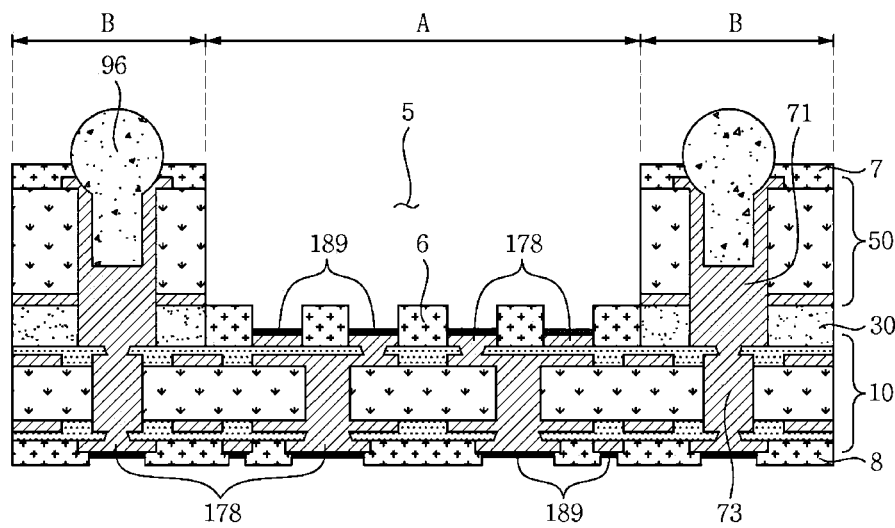

FIGS. 47 through 49 are a cross-sectional views of the first penetration via according to variations of the embodiment of FIG. 1.

Referring to FIG. 47, in the printed circuit board 1000, the ratio of region that fills the inside of the first penetration via 71 with the plug ink 160 is lowered, and the remaining region is plated. This is for resolving the occurrence of voids when filling with the plug ink 160.

Referring to FIGS. 48 and 49, the inside of the first penetration via 71 is not filled with the plug ink 160, a portion of the inside region is filled by plating, and the remaining region is filled with solder paste 95. Then, a solder ball 96 is finally formed through reflow and deflux steps so that it becomes possible to bond directly to the main board without forming additional ball for bonding.

Figure 50:
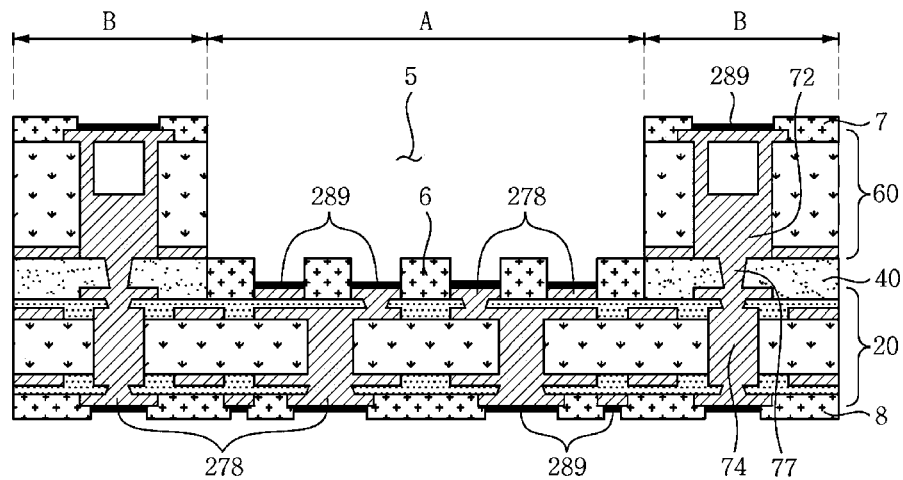
FIGS. 50 through 52 are cross-sectional views of various examples of a first penetration via of FIG. 2.
Figure 51:
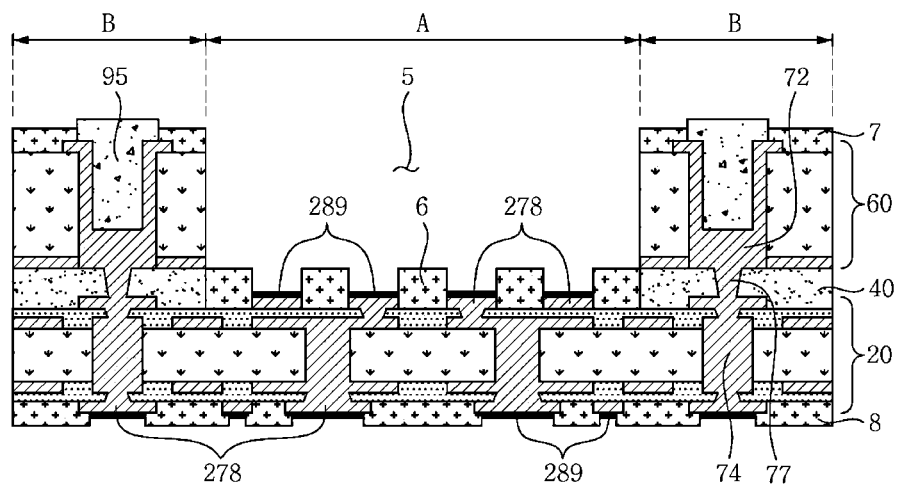
Figure 52:
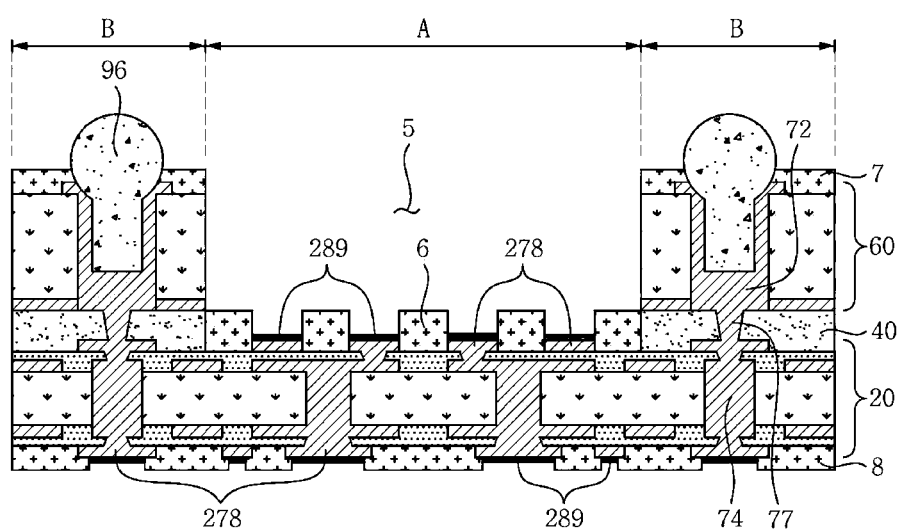

FIGS. 50 through 52 are a cross-sectional views of the first penetration via according to variations of the embodiment of FIG. 2.

The description of FIGS. 50 through 52 with regard to the first via 72 is similar to the description of FIGS. 47 through 49 with regard to the first via 71. Accordingly, further description of FIGS. 50-52 will not be provided.

In the printed circuit boards 1000 and 2000 disclosed herein, the occurrence of warpage may be minimized by the insulation layers 30 and 40 that function as the bonding sheet, and by forming the copper-clad laminate plates 50 and 60 on the respective insulation layers 30 and 40 by a lamination process.

In addition, by forming the second penetration vias 73 and 74 that are formed inside of the respective core boards 10 and 20 and the first penetration vias 71 and 72 that are formed outside of the respective core boards 10 and 20 individually, and connecting the first and second penetration vias to each other by means of a micro via or a circuit pattern, a stress that may occur when forming a via that penetrates both the first and the second surfaces of the printed circuit board may be minimized and a low degree of freedom for designing a penetration via may be improved.

Method of Manufacturing the Package

Figure 9:
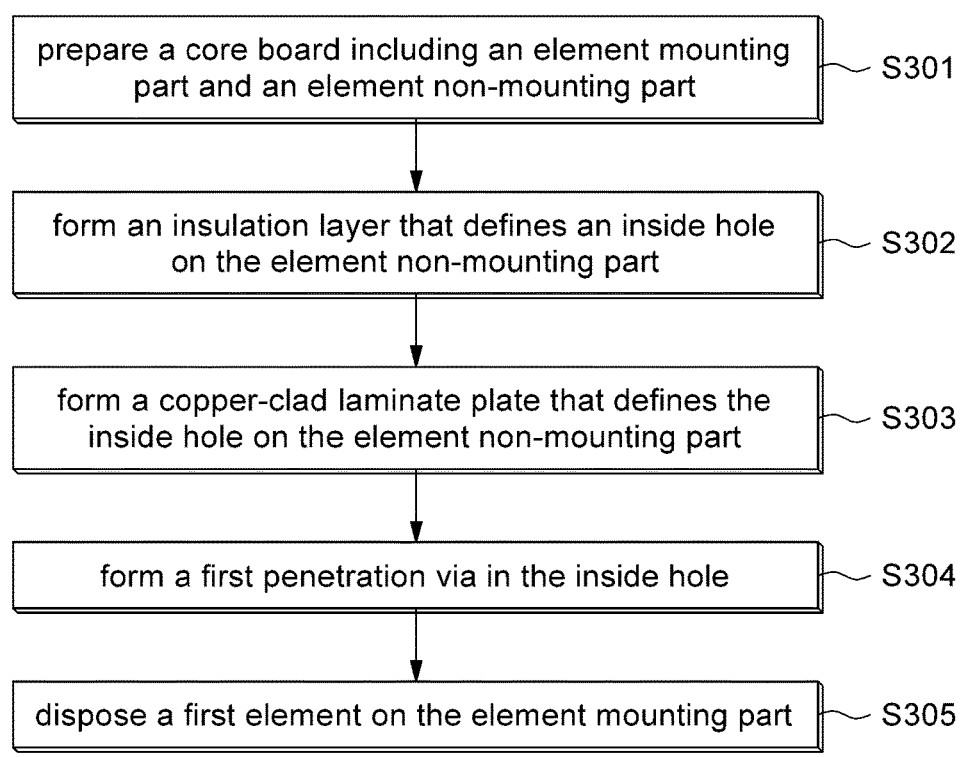
FIG. 9 is a flowchart showing a method of manufacturing the packages of FIGS. 3 and 4, according to an embodiment.

FIG. 9 is a flowchart showing an example method of manufacturing the package 1100 shown in FIG. 3.

Referring to FIGS. 3, 4, and 9, the method of manufacturing the package 1100 includes preparing a core board 10 that includes the element mounting part A and the element non-mounting part B on the first surface of the core board 10 (operation S301), forming the insulation layer 30 that defines an inside hole on the element non-mounting part B (operation S302), forming the copper-clad laminate plate 50 that further defines the inside hole on the insulation layer 30 (operation S303), forming the first penetration via 71 in the inside hole (operation S304), and disposing the first element 300 on the element mounting part A such that the first element 300 is electrically connected to the mounting pad 178 that is formed on the element mounting part A (operation S305). The first penetration via 71 is connected to the second penetration via 73 that is formed in the core board 10.

The package 1200 shown in FIG. 4 further includes the second element 400 that is formed on the second surface of the core board 10 such that the second element 400 is electrically connected to the mounting pad 178 that is formed on the second surface of the core board 10.

The additional description of the process of manufacturing the packages 1100 and 1200 is the same as about the description of the method of manufacturing the printed circuit board 1000, so the same description will not be repeated here.

Figure 10:
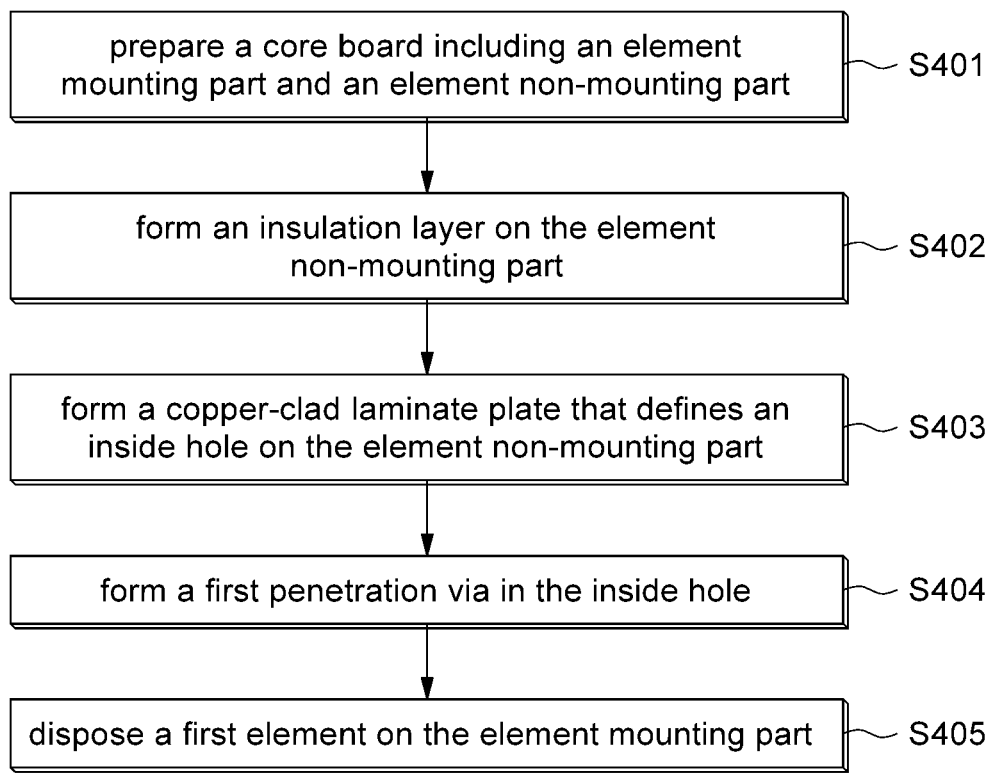
FIG. 10 is a flowchart showing a method of manufacturing the packages of FIGS. 5 and 6, according to an embodiment.
Figure 11:
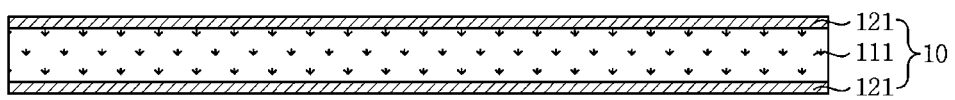
FIGS. 11 through 28 are process diagrams showing the method of manufacturing the printed circuit board of FIG. 1, according to an embodiment.
Figure 12:
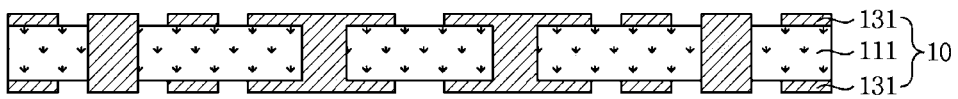
Figure 13:
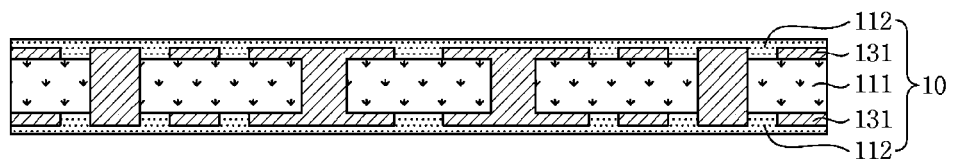
Figure 14:
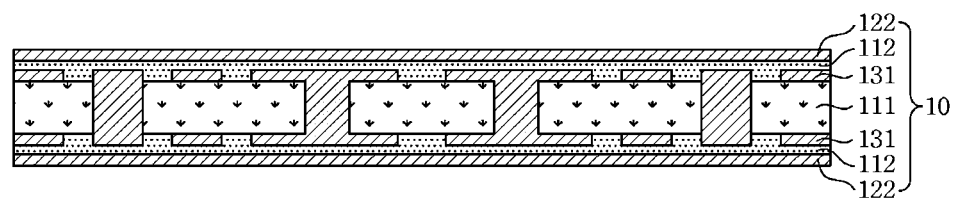
Figure 15:
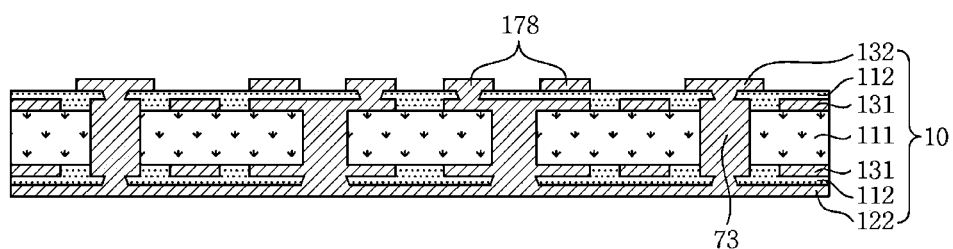

FIG. 10 is a flowchart showing an example method of manufacturing the package 2200 shown in FIG. 5.

Referring to FIGS. 5, 6, and 10, the method of manufacturing the package 2200 includes preparing the core board 20 that includes the element mounting part A and the element non-mounting part B on the first surface of the core board 20 (operation S401), forming the insulation layer 40 on the element non-mounting part B (operation S402), forming the copper-clad laminate plate 60 that defines an inside hole on the insulation layer 40 (operation S403), forming the first penetration via 72 in the inside hole (operation S404), and disposing the first element 300 on the element mounting part A such that the first element 300 is electrically connected to the mounting pad 278 that is formed on the element mounting part A (operation S405). The first penetration via 72 is connected to the second penetration via 74 that is formed in the core board 20 by the via 77 that is formed in the insulation layer 40.

The package 2300 shown in FIG. 6 further includes the second element 400 that formed on the second surface of the core board 20 such that the second element 400 is electrically connected to the mounting pad 278 that is formed on the second surface of the core board 10.

The additional description of the process of manufacturing the packages 2200 and 2300 is the same as about the description of the method of manufacturing the printed circuit board 2000, so the same description will not be repeated here.

In the packages 1100, 1200, 2200 and 2300 disclosed herein, the occurrence of warpage may be minimized. Additionally, by forming the second penetration vias that are formed inside of the core board and the first penetration vias that are formed outside of the core board individually and connecting the first and second penetration vias to each other by means of a micro via or a circuit pattern, a stress that may occur when forming a via that penetrates both the first and the second surfaces of the printed circuit board may be minimized and a low degree of freedom for designing a penetration via may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
 a core board comprising, on a first surface thereof, an element mounting part and an element non-mounting part;
 an insulation layer disposed on the element non-mounting part;

a copper-clad laminate plate disposed on the insulation layer;

a first penetration via extending through the insulation layer and the copper-clad laminate plate;

a second penetration via disposed in the core board and connected to the first penetration via, wherein the first penetration via comprises a wall on which a plating layer is formed, an exposed circuit pattern on which a metal post is formed, and an enclosure bounded by the plating layer and the metal post, the enclosure is filled with a plug ink, and the wall of the first penetration via is connected with a copper layer of the copper-clad laminate plate.

2. The printed circuit board of claim 1, further comprising a cavity disposed in the element mounting part and configured to receive an element.

3. The printed circuit board of claim 1, wherein:

the plating layer of the first penetration via contacts the exposed circuit pattern and surrounds the metal post.

4. The printed circuit board of claim 1, further comprising a mounting pad formed to be exposed to an outside of the printed circuit board on the element mounting part.

5. The printed circuit board of claim 4, further comprising a metal protection layer formed on a surface of the mounting pad that is exposed to the outside of the printed circuit board.

6. The printed circuit board of claim 1, further comprising a mounting pad formed to be exposed to an outside of the printed circuit board on a second surface of the core board.

7. The printed circuit board of claim 6, further comprising a metal protection layer formed on a surface of the mounting pad that is exposed to the outside of the printed circuit board.

8. A printed circuit board, comprising:

a core board comprising, on a first surface thereof, an element mounting part and an element non-mounting part;

an insulation layer disposed on the element non-mounting part;

a copper-clad laminate plate disposed on the insulation layer, wherein a copper layer separates a core of the copper-clad laminate plate from the insulation layer;

a first penetration via penetrating the copper-clad laminate plate and the insulation layer; and a second penetration via formed in the core board and connected to the first penetration via, wherein:

the first penetration via comprises a wall on which a plating layer is formed, the plating layer forms an enclosure extending a thickness of the core of the copper clad laminate plate, and includes a micro via extending through the insulation layer, the enclosure is filled with a plug ink, and the wall of the first penetration via is connected with the copper layer of the copper-clad laminate plate.

9. The printed circuit board of claim 8, further comprising a via disposed in the insulation layer and connecting the first penetration via to the second penetration via.

10. The printed circuit board of claim 8, further comprising a cavity formed in the element mounting part and configured to receive an element.

11. The printed circuit board of claim 8, further comprising a mounting pad formed to be exposed to an outside of the printed circuit board on the element mounting part.

12. The printed circuit board of claim 11, further comprising a metal protection layer formed on a surface of the mounting pad that is exposed to the outside of the printed circuit board.

13. The printed circuit board of claim 8, further comprising a mounting pad formed to be exposed to an outside of the printed circuit board on the second surface of the core board.

14. The printed circuit board of claim 13, further comprising a metal protection layer formed on a surface of the mounting pad that is exposed to the outside of the printed circuit board.

15. A package, comprising:

a printed circuit board, comprising:

a core board comprising, on a first surface of the printed circuit board, an element mounting part and an element non-mounting part, an insulation layer disposed on the element non-mounting part, a copper-clad laminate plate disposed on the insulation layer, and a first penetration via extending through the insulation layer and the copper-clad laminate plate; and a first element mounted in the element mounting part, wherein:

the first penetration via comprises a wall on which a plating layer is formed, an exposed circuit pattern on which a metal post is formed, and an enclosure bounded by the plating layer and metal post, the enclosure is filled with a plug ink, and the wall of the first penetration via is connected with a copper layer of the copper-clad laminate plate.

16. The package of claim 15 further comprising a second element mounted on a second surface of the printed circuit board and electrically connected to a mounting pad that is formed on the second surface of the printed circuit board.

17. A package, comprising:

a printed circuit board, comprising:

a core board comprising, on a first surface of the printed circuit board, an element mounting part and an element non-mounting part, an insulation layer disposed on the element non-mounting part, a copper-clad laminate plate formed on the insulation layer, and a first penetration via penetrating the copper-clad laminate plate; and a first element mounted in the element mounting part, wherein:

the first penetration via comprises a wall on which a plating layer is formed, the plating layer forms an enclosure extending a thickness of the copper clad laminate plate, and includes a micro via extending through the insulation layer, the enclosure is filled with a plug ink, and the wall of the first penetration via is connected with a copper layer of the copper-clad laminate plate.

18. The package of claim 17 further comprising a second element mounted on the second surface of the printed circuit board and electrically connected to a mounting pad that is formed on the second surface of the printed circuit board.

* * * * *